(12) United States Patent
Kamata

(10) Patent No.: US 6,180,455 B1
(45) Date of Patent: Jan. 30, 2001

(54) SEMICONDUCTOR DEVICE AND METHOD OF MANUFACTURING THE SAME

(75) Inventor: Yutaka Kamata, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/243,471

(22) Filed: Feb. 3, 1999

Related U.S. Application Data

(62) Division of application No. 08/851,080, filed on May 5, 1997.

(30) Foreign Application Priority Data

Jun. 14, 1996 (JP) .................................................. 8-175507

(51) Int. Cl.$^7$ .............................................. H01L 21/8247
(52) U.S. Cl. .......................................... 438/258; 438/527
(58) Field of Search .................................. 438/257–267, 438/527

(56) References Cited

U.S. PATENT DOCUMENTS

| | | |
|---|---|---|
| 5,373,476 | 12/1994 | Jeon . |
| 5,407,844 | 4/1995 | Smayling et al. . |
| 5,411,908 | 5/1995 | Santin et al. . |
| 5,494,851 | 2/1996 | Lee et al. . |
| 5,504,708 | 4/1996 | Santin et al. . |
| 5,514,889 | 5/1996 | Cho et al. . |
| 5,545,911 | 8/1996 | Otsuki et al. . |
| 5,604,150 | 2/1997 | Mehrad . |
| 5,627,099 | 5/1997 | Sasaki . |
| 5,663,084 | * 9/1997 | Yi et al. ................................ 438/453 |
| 5,691,233 | 11/1997 | Matsumoto . |
| 5,712,178 | * 1/1998 | Cho et al. . |
| 5,761,127 | 6/1998 | Akaogi et al. . |
| 5,789,788 | 8/1998 | Ema et al. . |
| 5,911,105 | * 6/1999 | Sasaki ................................ 438/258 |

FOREIGN PATENT DOCUMENTS

| | | |
|---|---|---|
| 42 30 687 A1 | 5/1993 | (DE) . |
| 0 545 082 A2 | 11/1992 | (EP) . |
| 0 470 716 A2 | 12/1992 | (EP) . |

* cited by examiner

*Primary Examiner*—Richard Booth
(74) *Attorney, Agent, or Firm*—Jones Volentine, LLC

(57) ABSTRACT

An object of the present invention is to manufacture a semiconductor device excellent in withstand-voltage property of each element formed in a peripheral element region portion, without incurring complexity of a manufacturing process.

Impurity ions are injected into a substrate so as to form a first well portion and field oxide films for partitioning a substrate surface including the surface of the first well portion into a plurality of active regions. Further, the impurity ions are injected into the first well portion so as to form a second well portion having a plurality of active regions. Regions corresponding to the active regions on the second well portion are exposed and a mask for covering regions other than the above regions is formed. Ions are injected into the second well portion exposed from the mask under the action of energy transmitted through the field oxide films.

13 Claims, 2 Drawing Sheets

SEMICONDUCTOR DEVICE AND METHOD OF MANUFACTURING THE SAME

CROSS REFERENCE TO RELATED APPLICATIONS

This is a divisional application of application Ser. No. 08/851,080, filed May 5, 1997, which is hereby incorporated by reference in its entirety for all purposes.

BACKGROUND OF THE INVENTION

1. Field of the Invention

This invention relates to a semiconductor device having a semiconductor substrate with a double well structure in which two wells different in conductivity from each other are formed within the semiconductor substrate and a method of manufacturing the semiconductor device.

2. Description of the Related Art

The following semiconductor substrate may be used to manufacture a semiconductor memory device including a nonvolatile semiconductor element such as an EP-ROM (Erasable and Electrically Programmable Read Only Memory) or an EEP-ROM (Electrically-Erasable Programmable Read Only Memory), or a CMOS (Complementary Metal-Oxide Semiconductor). This type of semiconductor substrate has a first well portion and a second well portion. The first well portion is exposed onto the surface of the semiconductor substrate and different in conductivity from the substrate. The second well portion is formed so as to be bared on the surface of the semiconductor substrate in the first well portion and is identical in conductivity to the substrate.

The semiconductor substrate having such a double well structure includes the following forming process. The first well portion is formed by injecting impurity ions into the semiconductor substrate. Further, ions (hereinafter called "channel stop ions") for forming channel stop regions are injected into a field insulating film forming region excluding the first well portion of the substrate. After the formation of field insulating films, the second well portion is formed within the first well portion by the injection of the impurity ions.

The second well portion has a plurality of active regions. These active regions are used as a memory array region portion for a non-volatile storage element and a peripheral element region portion for circuits around the non-volatile storage element.

The impurity ions, which have been injected to form the second well portion, were considered to have ensured a source-to-drain withstand voltage property of each of transistors formed within the peripheral element region portion. Therefore, the channel stop ions have been injected only into the memory array region portion after the formation of the second well portion.

SUMMARY OF THE INVENTION

With the foregoing in view, it is therefore an object of the present invention to provide a semiconductor device capable of preventing deterioration in withstand voltage properties of elements formed in a peripheral element region portion.

It is another object of the present invention to provide a mask capable of preventing the concentration of impurities in active regions from excessively increasing and further simplifying a process for manufacturing a semiconductor device.

According to one aspect of the present invention, for achieving another object referred to above, there is provided a semiconductor device of the present invention, comprising:

a double well structure having a first well portion and a second well portion both of which are different in polarity from each other;

a semiconductor substrate whose surface common to the surfaces of the two well portions is partitioned into a plurality of active regions by field insulating films; and a memory array region portion and a peripheral element region portion both formed within the second well portion, whereby channel stop regions are formed within the memory array region portion and the peripheral element region portion by ion implantation.

According to another aspect of the present invention, for achieving another object referred to above, there is provided a mask comprising:

portions for respectively covering active regions lying within a second well portion;

portions for respectively covering edge portions of field insulating films adjacent to the active regions; and openings through which channel stop ions can be injected below the field insulating films of a semiconductor substrate region excluding a first well portion.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

FIG. 1 is a diagram showing a first embodiment of a method of manufacturing a semiconductor device according to the present invention.

Figure 1A:
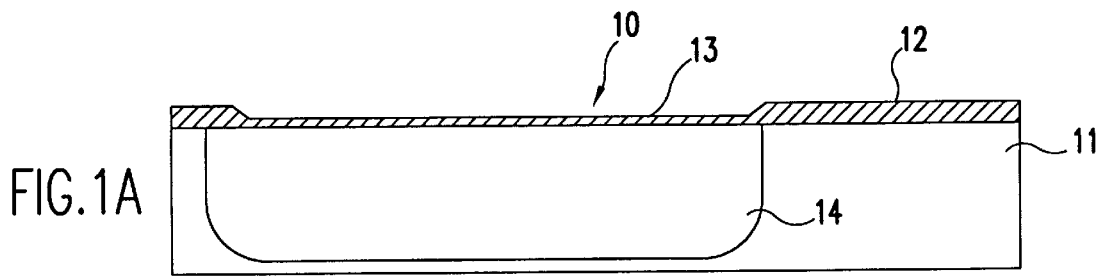
FIG. 1 is a diagram showing a first embodiment of a method of manufacturing a semiconductor device according to the present invention.

As shown in FIG. 1(a) by way of example, a p-type silicon semiconductor substrate 11 is used as a substrate for a semiconductor memory device 10. The surface of the semiconductor substrate 11 is covered with a masking oxide film 12 having a thickness of 5000 Å, for example. A portion for covering a predetermined region corresponding to a region within the oxide film 12, for forming a first well portion of the semiconductor substrate 11 is removed from the oxide film 12 by photolithography and etching. To protect the surface of the semiconductor substrate 11 from ion implantation in the next step, an oxide film 13 having a thickness of 1000 Å, for example, is formed on an exposed portion of the semiconductor substrate 11 from which the oxide film 12 has been partially removed.

Phosphorous ions are selectively implanted into the semiconductor substrate 11 from which the oxide film 12 has been partially removed and whose surface has been protected by the oxide film 13, as donors in a state in which their accelerating voltage and the concentration of the ions have been set to 180 keV and $10^{13}$ ions/cm$^2$ respectively. At this time, the oxide film 12 is utilized as a mask. In order to control a diffusion length for the impurity ions after the ion implantation referred to above, the semiconductor substrate is subjected to a drive-in process for about 60 minutes in an atmosphere of nitrogen gas brought to a temperature of 1150° C. Owing to the drive-in process, a first well portion 14 having conductivity different from that of the semiconductor substrate 11 is formed in a region exposed from the oxide film 12 on the semiconductor substrate 11.

Figure 1B:
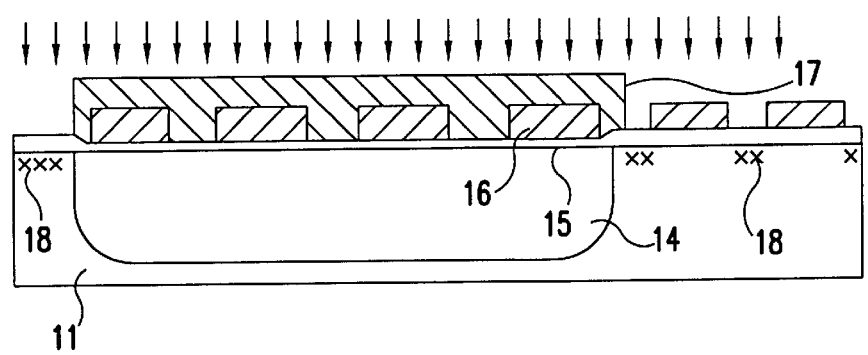

After the formation of the first well portion, the masking oxide film 12 and the protective oxide film 13 are removed as shown in FIG. 1(b). Thereafter, a pad oxide film 15 and each of silicon nitride films 16 are formed on the surface of the semiconductor substrate 11.

The following method has heretofore been well known as a LOCOS (Local Oxidation of Silicon) method, and the 'silicon nitride film 16 makes it possible to selectively oxidize the semiconductor substrate 11 by depressing or controlling the oxidation of the semiconductor substrate 11 when each field insulating film is formed under the oxidation of the semiconductor substrate 11, as will be described later. Further, the pad oxide film 15 absorbs the difference in thermal expansion between the silicon nitride film 16 and the semiconductor substrate 11 so as to relieve thermal strains produced in the semiconductor substrate 11.

Accordingly, the pad oxide film 15 is formed so as to cover the entire surface of the semiconductor substrate 11. On the other hand, the silicon nitride film 16 is formed so as to selectively cover portions excluding regions for forming the field insulating films with the pad oxide film 15 interposed between the silicon nitride film 16 and the semiconductor substrate 11.

After the formation of the pad oxide film 15 and each silicon nitride film 16, a mask 17 is formed so as to cover the first well portion 14. Thereafter, boron ions, which serve as acceptors, are implanted into the semiconductor substrate as channel stop ions in a state in which their accelerating voltage has been set to 30 keV and the concentration of the ions has been set to $7 \times 10^{13}$ ions/cm$^2$.

The channel stop ions are selectively injected into portions or regions exposed from the selectively-formed silicon nitride films 16, of regions for the semiconductor substrate 11, which are exposed from the mask 17. In the regions exposed from the silicon nitride films 16, of the regions for the semiconductor substrate 11, which exclude the first well portion 14, the injected boron ions 18 can retard or control the generation of an inversion layer which leads to a source of generation of a parasitic or back channel upon formation of the field insulating films.

Figure 1C:
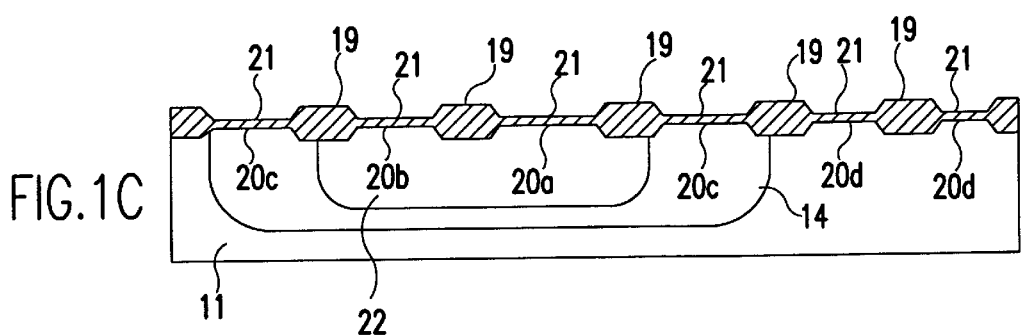

After the mask 17 has been subjected to ashing, the semiconductor substrate 11 is subject to an oxidation process in an atmosphere of high-temperature steam in a state in which the pad oxide film 15 and the selectively-formed silicon nitride films 16 have been left behind. Owing to the oxidation process, the portions of the semiconductor substrate 11, which have not been covered with the selectively-formed silicon nitride films 16, grow as field insulating films 19 as shown in FIG. 1(c). Each field insulating film 19 has a thickness of 5000 Å, for example.

The field insulating films 19 partition the surface of the semiconductor substrate 11 into a number of partitioned active regions 20 (20a, 20b, 20c and 20d).

After the formation of the field insulating films 19, the pad oxide film 15 and the selectively-formed silicon nitride films 16 are removed as shown in FIG. 1(c). Further, the active regions 20 are covered with their corresponding silicon oxide films 21 to eliminate nitrides.

Although not shown in the drawing, a mask similar to the mask 17 is thereafter formed so as to make bare a predetermined region in the first well portion 14 of the semiconductor substrate 11. Next, the boron ions, which function as the acceptors, are selectively injected into the predetermined region within the first well portion 14 in a state in which their accelerating voltage and the concentration of the ions have been set to 200 keV and $10^{13}$ ions/cm$^2$ respectively. After the injection of the ions therein, the predetermined region is subjected to the drive-in process for about 60 minutes in an atmosphere of the nitrogen gas brought to the temperature of 1150° C., for example. Owing to this heat treatment, a second well portion 22 exposed onto the surface of the semiconductor substrate 11 and having a polarity opposite to that of the first well portion 14, is formed within the first well portion 14. Further, the second well portion 22 may be formed prior to the formation of the field insulating films 19.

In the illustrated embodiment, the second well portion 22 includes two active regions 20a and 20b. The first well portion 14 includes two active regions 20c. A substrate portion of the semiconductor substrate 11 includes two active regions 20d.

In the semiconductor memory device 10, one active region 20a in the second well portion 22 is used as a memory array region portion. For example, nMOS memory elements are formed within the memory array region portion 20a. The other active region 20b in the second well portion 22 is utilized as a peripheral element region portion 20b used for circuit elements around these memory elements. For instance, an NMOS or the like for performing switching action is formed within the peripheral element region portion 20b.

Further, a semiconductor element such as a PMOS, or a circuit element or the like is formed within each active region 20c in the first well portion 14 as needed.

Prior to the formation of such elements, channel stop ions are collectively injected into the memory array region portion 20a and the peripheral element region portion 20b in the second well portion 22.

Figure 1D:
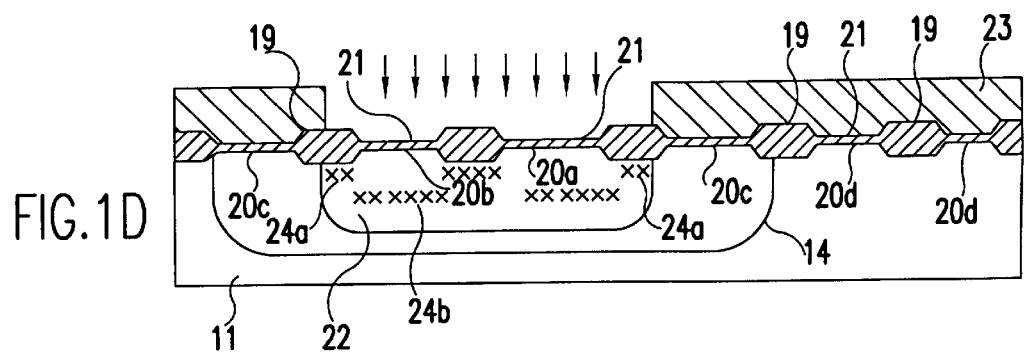

In order to selectively inject the channel stop ions into the memory array region portion 20a and the peripheral element region portion 20b, the memory array region portion 20a and the peripheral element region portion 20b are exposed and a mask 23 is formed so as to cover other portions, as shown in FIG. 1(d).

The mask 23 is used as a pattern mask and the channel stop ions are selectively injected into the memory array region portion 20a and the peripheral element region portion 20b.

Boron ions are used as the channel stop ions. The boron ions are accelerated at an accelerating voltage of 200 keV to allow the boron ions to pass through each field oxide film 19 and supply energy enough for the boron ions to reach the second well portion 22. The concentration of the ions at that time is $10^{13}$ ions/cm$^2$.

With the injection of the channel stop ions, boron ions 24 (24a and 24b) are implanted into portions below the field oxide films 19, the memory array region portion 20a and the peripheral element region portion 20b in the second well portion 22.

The silicon oxide films 21 are eliminated after the implantation of the channel stop ions. New unillustrated gate oxide films are formed on the active regions 20a and 20b. Thereafter, memory elements and peripheral circuit elements such as a peripheral transistor, etc. are respectively formed on the gate oxide films so as to fall within the memory array region portion 20a and the peripheral element region portion 20b in accordance with the well-known method similar to the prior art.

The boron ions 24 have been injected into the memory array region portion 20a and the peripheral element region portion 20b indicative of the active regions in which the memory elements and the peripheral circuit elements are respectively formed and into the portions including the portions below the field insulating films 19 in the second well portion 22. Accordingly, the injected boron ions can compensate for the amount of boron ions absorbed by the field insulating films 19, of the boron ions injected upon formation of the second well portion 22.

The boron ions 24a injected to the portions below the field insulating films 19 in the second well portion 22 form channel stop regions. Owing to the formation of the channel stop regions in this way, the generation of inversion layers at the field insulating films 19 is effectively controlled.

The fabrication of the semiconductor device in accordance with the manufacturing process referred to above can improve source-to-drain withstand voltage properties of the transistors formed in the memory array region portion 20a and the peripheral element region portion 20b in the second well portion 22. Since the inversion layers can be reliably prevented from being formed in the second well portion 22, it is possible to control the generation of the back channel which results in a reduction in threshold.

Thus, according to the method of the present invention, since the channel stop ions can be collectively injected into the memory array region portion 20a and the peripheral element region portion 20b, a semiconductor device excellent in electric characteristics can be manufactured relatively easily without complicating the process for manufacturing the semiconductor device.

Figure 2:
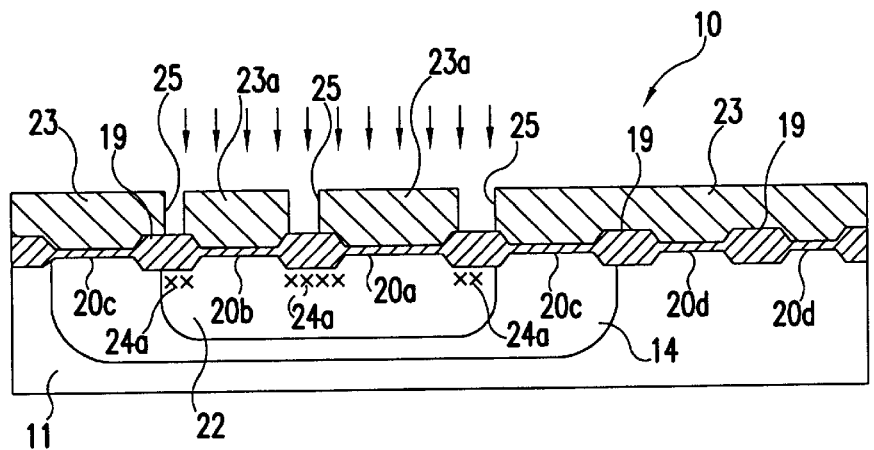
FIG. 2 is a diagram similar to FIG. 1(d), which illustrates a second embodiment of a method of manufacturing a semiconductor device, for avoiding a great increase in impurity concentration within a second well portion.

FIG. 2 is a diagram similar to FIG. 1(d), which shows a second embodiment of a method of manufacturing a semiconductor device, for avoiding a great increase in the concentration of impurities in a second well portion.

In the embodiment illustrated in FIG. 2, each of mask 23 used to selectively inject channel stop ions into the second well portion 22 has auxiliary mask portions 23a for respectively covering a memory array region portion 20a and a peripheral element region portion 20b.

The respective auxiliary mask portions 23a also cover edge portions of field insulating films 19 adjacent to their active regions. It is desirable that the width of a portion where the field insulating film 19 and each auxiliary mask portion 23a overlap each other, is about 0.2 µm or more.

Thus, openings 25 are defined in the auxiliary mask portions 23a so that the channel stop ions can be injected only into portions immediately below the central portions of the field insulating films 19 in the second well portion 22.

Accordingly, the openings 25 allow the injection of channel stop ions 24a into the portions immediately below the central portions of the field insulating films 19 in the second well portion 22. Further, the auxiliary mask portions 23a prevent the channel stop ions from being injected into the central portions of the memory array region portion 20a and the peripheral element region portion 20b.

In the second embodiment as understood from the above description, since the concentration of boron ions in the second well portion 22 does not increase, a withstand-voltage property at the junction of the drain or source of each element on the second well portion 22 and the second well portion 22 is not deteriorated. It is therefore possible to make an improvement in source-to-drain withstand voltage property of each of transistors formed in the memory array region portion 20a and the peripheral element region portion 20b in the second well portion 22.

Further, since the inversion layers are reliably formed within the second well portion 22, an electrically-excellent semiconductor device can be efficiently manufactured which is capable of controlling the generation of a parasitic channel incurring a reduction in threshold.

Figure 3:
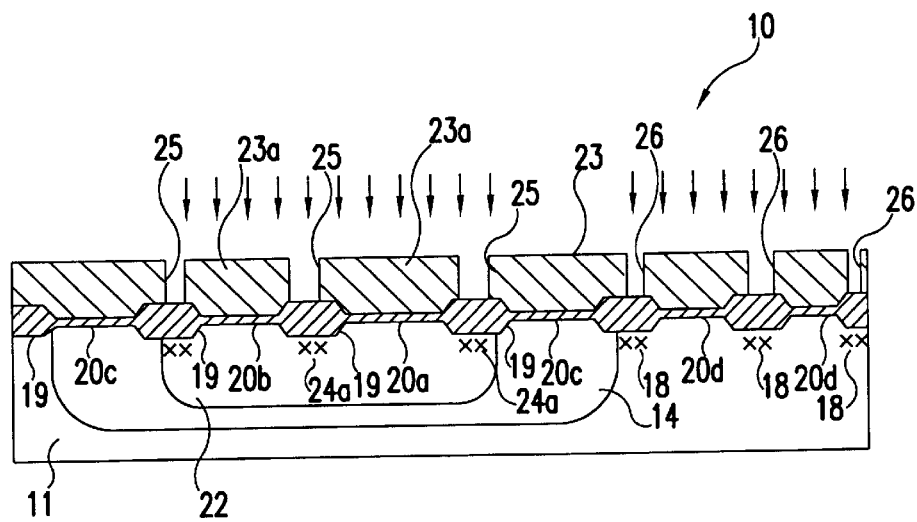
FIG. 3 is a diagram similar to FIG. 1(d), which shows a third embodiment of a method of manufacturing a semiconductor device, which is capable of collectively injecting channel stop ions into a predetermined region.

FIG. 3 is a diagram similar to FIG. 1(d), which shows a third embodiment of a method of manufacturing a semiconductor device, which is capable of simultaneously performing all the process steps for injecting channel stop ions.

In the embodiment illustrated in FIG. 3, a mask 23 used to selectively inject the channel stop ions into the second well portion 22 has openings 26 defined therein in addition to the auxiliary mask portions 23a provided with the openings 25 described in the second embodiment. The openings 26 allow the channel stop ions to be injected into portions immediately below field insulating films 19 on the surface of a semiconductor substrate except for the first and second well portions.

Thus, in the third embodiment, the injection of the channel stop ions into the second well portion 22 and the injection of the channel stop ions into a substrate portion of the semiconductor substrate 11 can be simultaneously performed. Namely, it is unnecessary to execute the process step described in accordance with FIG. 1(b) in the first embodiment, for singly injecting the channel stop ions into the substrate portion on the surface of the semiconductor substrate 11.

As a result, a semiconductor device excellent in electric characteristics can be manufactured more efficiently.

The type of ions or the numerical values of accelerating energy and ion concentration or the like, which have been described in the respective embodiments, are merely shown as examples. These values can be suitably selected as needed. Further, the semiconductor device manufacturing method according to the present invention has described the case in which the semiconductor device is fabricated using the semiconductor substrate formed with the non-volatile semiconductor element thereon. However, the present method is not necessarily limited to this. The method can be applied even to the formation of a double well structure of a semiconductor substrate having a volatile semiconductor element formed thereon, which is composed of a combination of a capacitor and a MOSFET (Metal-Oxide Semiconductor Field Effect Transistor), for example.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising the following steps:

a step for forming a semiconductor substrate having a double well structure composed of a first well portion formed by introducing first impurity ions into a first region on a main surface of the semiconductor substrate and, field insulating films formed on the main surface of the semiconductor substrate so as to part the main surface of the semiconductor substrate into a plurality of active regions, and a second well portion formed by introducing second impurity ions into a second region on a main surface of the semiconductor substrate with the first region so as to part the main surface of said second well portion into a first active region and a second active region;

a step for forming a memory array on said first active region and a peripheral element on said second active region;

a step for exposing said first active region, said second active region and said field insulating films on said second well portion and forming a mask for covering regions other than a predetermined region; and a step for introducing third impurity ions having energy for said third impurity ions to transmit through said field insulating films after forming said second well portion.

2. A method as claimed in claim 1, further including the following step:

a step for introducing said second impurity ions having energy for said second impurity ions to transmit through said field insulating films after forming said second well portion.

3. A method as claimed in claim 1, further including the following steps:

a step for exposing said first active region, said second active region, said field insulating films on the main surface of said second well portion and at least central portions of said field insulating films on the main surface of said semiconductor substrate and forming a mask for covering regions other than said predetermined region; and a step for introducing said third impurity ions selectively and collectively.

4. A method as claimed in claim 1, further including the following steps:

a step for exposing said first active region and said second active region and forming a mask for covering regions other than said predetermined region; and a step for introducing said third impurity ions selectively and collectively.

5. A method as claimed in claim 1, further including the following steps:

a step for exposing said first active region, said second active region and at least central portions of said field insulating films on the main surface of said semiconductor substrate and forming a mask for covering regions other than said predetermined region; and a step for introducing said third impurity ions selectively and collectively.

6. A method as claimed in claim 4, further including the following steps:

a step for exposing said first active region, said second active region and at least central portions of said field insulating films on the main surface of said second well portion and forming a mask for covering regions other than said predetermined region; and a step for introducing said third impurity ions selectively and collectively.

7. A method as claimed in claim 1, further including the following steps:

a step for exposing said first active region, said second active region and at least central portions of said field insulating films on the main surface of said semiconductor substrate and said second well portion and forming a mask for covering regions other than said predetermined region; and a step for introducing said third impurity ions selectively and collectively.

8. A method as claimed in claim 1, further including the following steps:

a step for exposing said second active region and forming a mask covering regions other than said predetermined region; and a step for introducing said third impurity ions selectively and collectively.

9. A method as claimed in claim 1, further including the following steps:

a step for exposing said second active region and at least central portions of said field insulating films on the main surface of said second well portion and forming a mask covering regions other than said predetermined region; and a step for introducing said third impurity ions selectively and collectively.

10. A method as claimed in claim 1, further including the following step:

a step for exposing said second active region and at least central portions of said field insulating films on the main surface of said semiconductor substrate and forming a mask covering regions other than said predetermined region; and a step for introducing said third impurity ions selectively and collectively.

11. A method as claimed in claim 1, further including the following step:

a step for exposing said second active region and at least central portions of said field insulating films on the main surface of said semiconductor substrate and said second well portion and forming a mask covering regions other than said predetermined region; and a step for introducing said third impurity ions selectively and collectively.

12. A method as claimed in claim 1, further including the following step:

a step for exposing at least central portions of said field insulating films on the main surface of said second well portion and forming a mask covering regions other than said predetermined region; and a step for introducing said third impurity ions selectively and collectively.

13. A method as claimed in claim 12, further including the following step:

a step for exposing at least central portions of said field insulating films on the main surface of said semiconductor substrate and said second well portion and forming a mask covering regions other than said predetermined region; and a step for introducing said third impurity ions selectively and collectively.

* * * * *